United States Patent
Tung et al.

(10) Patent No.: US 10,736,234 B2
(45) Date of Patent: Aug. 4, 2020

(54) GAS STORAGE DEVICE

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW); Hung-Jung Hsia, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 56 days.

(21) Appl. No.: 16/215,593

(22) Filed: Dec. 10, 2018

(65) Prior Publication Data

US 2020/0163252 A1 May 21, 2020

(30) Foreign Application Priority Data

Nov. 16, 2018 (CN) .......................... 2018 1 1365989

(51) Int. Cl.
*H05K 7/00* (2006.01)
*H05K 7/20* (2006.01)

(52) U.S. Cl.
CPC ......... *H05K 7/20327* (2013.01); *H05K 7/203* (2013.01)

(58) Field of Classification Search
CPC ...... H05K 7/203; H05K 7/20327; F17C 1/00; F17C 7/00; B05B 11/00412; B67D 1/0402; B65D 77/06; B65D 81/3233

USPC ................. 222/105, 3–4, 405, 386
See application file for complete search history.

(56) References Cited

U.S. PATENT DOCUMENTS

| | | | | |
|---|---|---|---|---|
| 6,358,239 B1* | 3/2002 | Rake | ..................... | A61M 5/148 128/DIG. 12 |
| 8,763,857 B2* | 7/2014 | Middleton | ......... | B65D 83/0077 222/103 |
| 10,149,408 B2* | 12/2018 | Fujiwara | ............ | H05K 7/20318 |
| 2010/0059544 A1* | 3/2010 | Dijkstra | ............. | B65D 83/0077 222/95 |
| 2012/0104020 A1* | 5/2012 | Cur | ....................... | B67D 1/0001 222/1 |
| 2014/0224837 A1* | 8/2014 | Eisenbacher | ...... | F01M 11/0458 222/105 |

* cited by examiner

*Primary Examiner* — Paul R Durand
*Assistant Examiner* — Andrew P Bainbridge
(74) *Attorney, Agent, or Firm* — CKC & Partners Co., LLC (57) ABSTRACT

A gas storage device includes a hollow casing, a gas storage bag, a gas tube, and a retractable module. The hollow casing has a casing top, a casing sidewall, and a casing bottom. The gas storage bag is located in the hollow casing. The gas tube is arranged through the casing bottom and in fluid communication between the gas storage bag and an exterior space. The retractable module is connected between a top surface of the gas storage bag and the casing top. The gas storage bag expands when fluid is filled into the gas storage bag through the gas tube, such that the retractable module is folded. The gas storage bag contracts when fluid is drawn out of the gas storage bag through the gas tube, such that the retractable module is unfolded.

10 Claims, 6 Drawing Sheets

GAS STORAGE DEVICE

CROSS-REFERENCE TO RELATED APPLICATION

This application claims priority to China Application Serial Number 201811365989.0, filed on Nov. 16, 2018, which is herein incorporated by reference in its entirety.

BACKGROUND

Field of Invention

The present disclosure relates to a gas storage device, and particularly, to a gas storage device for an atmospheric two-phase immersion cooling system.

Description of Related Art

In an atmospheric two-phase immersion cooling system, a component is placed into a dielectric liquid with low boiling point. Heat generated by the component then may be dissipated by a phase change of the dielectric liquid. More specifically, when the dielectric liquid absorbs the heat from the component, the dielectric liquid may be evaporated and transformed into a dielectric liquid vapor. Therefore, the conventional atmospheric two-phase immersion cooling system is equipped with a bellow-type or bag-type gas storage device. Due to the above-mentioned gas storage device, the dielectric liquid vapor can be temporarily stored to avoid wasteful leakage of the dielectric liquid vapor.

The bellow-type gas storage device has a gas storage structure resembling an accordion bellow. Due to the bellow-shaped gas storage structure, the gas storage device may present a linear volume change as the height of the gas storage device changes. This feature may facilitate the observation of the amount of stored dielectric liquid vapor. However, the fold design of the bellow-shaped gas storage structure may cause difficulties in production, and also make the fold line and/or the seam thereon easily broken, thereby losing the gas storage function. In addition, since the fold structure may hardly be produced to be accurately symmetrical, unexpected deformation such as asymmetric expansion may happen to the bellow-shaped gas storage structure. Hence, observing the amount of stored dielectric liquid vapor may be interfered.

On the other hand, the bag-type gas storage device utilizes an aluminum foil bag as the gas storage structure. More specifically, in comparison with the bellow-type gas storage device, the manufacturing of aluminum foil bag is relatively simple, and the bag-shaped structure may reduce the fold line and/or the seam thereon, thereby lowering the breakage possibilities of the bag. However, when the dielectric liquid vapor is filled into the aluminum foil bag, the aluminum foil bag may expand as an irregular-shaped pouch. Hence, observing the amount of stored dielectric liquid vapor in the bag-type gas storage device may be difficult.

In other words, the conventional gas storage device may encounter some problems, such as structural breakage easily happening thereto and observing the amount of stored dielectric liquid vapor inside thereof being difficult, as described above. Therefore, it is desirable to provide a gas storage device that is capable of tackling the aforementioned problems.

SUMMARY

In accordance with one or more embodiments of the present disclosure, a gas storage device is provided and includes a hollow casing, a gas storage bag, a gas tube, and a retractable module. The hollow casing has a casing top, a casing sidewall, and a casing bottom. The gas storage bag is disposed in the hollow casing. The gas tube is disposed through the casing bottom and in fluid communication between the gas storage bag and an exterior space. The retractable module is connected between a top surface of the gas storage bag and the casing top. The gas storage bag expands when fluid is filled into the gas storage bag through the gas tube, such that the retractable module is folded. The gas storage bag contracts when fluid is drawn out of the gas storage bag through the gas tube, such that the retractable module is unfolded.

In some embodiments, the retractable module includes a plurality of retractable mechanisms and a bottom plate. The bottom plate is connected to the top surface of the gas storage bag. The at least one of the retractable mechanisms includes a slide rail, a slide block, and a connection rod. The slide rail is disposed on the casing top. The slide block is movably connected to the slide rail. The connection rod has two ends pivotally connected to the slide block and the bottom plate respectively. The slide block slides parallel to the casing top in response to an operation of the connection rod.

In some embodiments, the retractable module includes a first retractable mechanism and a second retractable mechanism. The first retractable mechanism is disposed adjacent to a peripheral region of the top surface of the gas storage bag and connected to the casing top. The second retractable mechanism is disposed adjacent to the peripheral region of the top surface of the gas storage bag, in parallel spaced relationship to the first retractable mechanism, and connected to the casing top.

In some embodiments, the retractable module further includes a third retractable mechanism that is connected to a central region of the casing top.

In some embodiments, pivotal joints of the respective connection rods of the first, second, and third retractable mechanisms and the bottom plate are not distributed on the same straight line.

In some embodiments, the bottom plate of the retractable module is a unitary flat member, and a cross section of the casing sidewall of the hollow casing and a top surface of the bottom plate are both circular.

In some embodiments, an area of a top surface of the bottom plate is smaller than a cross section area of the casing sidewall of the hollow casing.

In some embodiments, the top surface of the bottom plate and a bottom surface of the bottom plate have the same area, and the bottom surface of the bottom plate and the top surface of the gas storage bag have the same area.

In some embodiments, when the retractable module is folded or unfolded, each pivotal joint of the respective connection rods of the first, second, and third retractable mechanisms and the bottom plate is located outside a projection area of the respective slide rails on the bottom plate.

In some embodiments, a lower half of a side surface of the gas storage bag is bonded to the casing sidewall.

In some embodiments, the gas storage device further includes a sensor disposed in the hollow casing and configured to measure a volume of the gas storage bag.

Further herein described, according to one or more embodiments of the gas storage device, the gas storage device of the present disclosure may restrict the expansion and contraction of the gas storage bag by the hollow casing and the retractable module to make the observation of the volume change of the gas storage bag more convenient. More specifically, the hollow casing may limit the horizontal expansion of the gas storage bag, such that the gas storage bag may only expand or contract in the vertical direction. Since the bottom plate of the retractable module is entirely connected to the top surface of the gas storage bag, the gas storage bag may raise the bottom plate vertically when the gas storage bag extends in the vertical direction. On the other hand, the side surface of the gas storage bag may be bonded to the hollow casing below a certain height thereof. When the volume of the gas storage bag decreases, the bottom plate may descend vertically as the gas storage bag contracts in the vertical direction. Further, when the height of the bottom plate drops to the certain height mentioned above, the side surface of the gas storage bag below the certain height may no longer be folded. Subsequently, as the bottom plate continues to descend, the side surface of the gas storage bag above the certain height may be successively and movably attached onto the side surface of the gas storage bag below the certain height, such that a double-layer structure of the gas storage bag may be formed. Consequently, a user may easily know the volume of the gas storage bag and the change thereof simply by observing the position of the bottom plate in the vertical direction. Additionally, the gas storage device of the present disclosure may utilize an integrally formed gas storage bag to store inflow fluid, thereby minimizing occurrence of structural breakage.

The above-mentioned descriptions are merely used to set forth the problems to be solved, the technical means for solving the problems, and the unexpected effects achieved by the present disclosure. More detailed descriptions of the present disclosure will be explicitly described in various embodiments coordinated with related drawings as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. The dimensions of the various features may be arbitrarily increased or reduced for clarity of discussion.

DETAILED DESCRIPTION

The following disclosure provides various embodiments, or examples, for implementing various features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
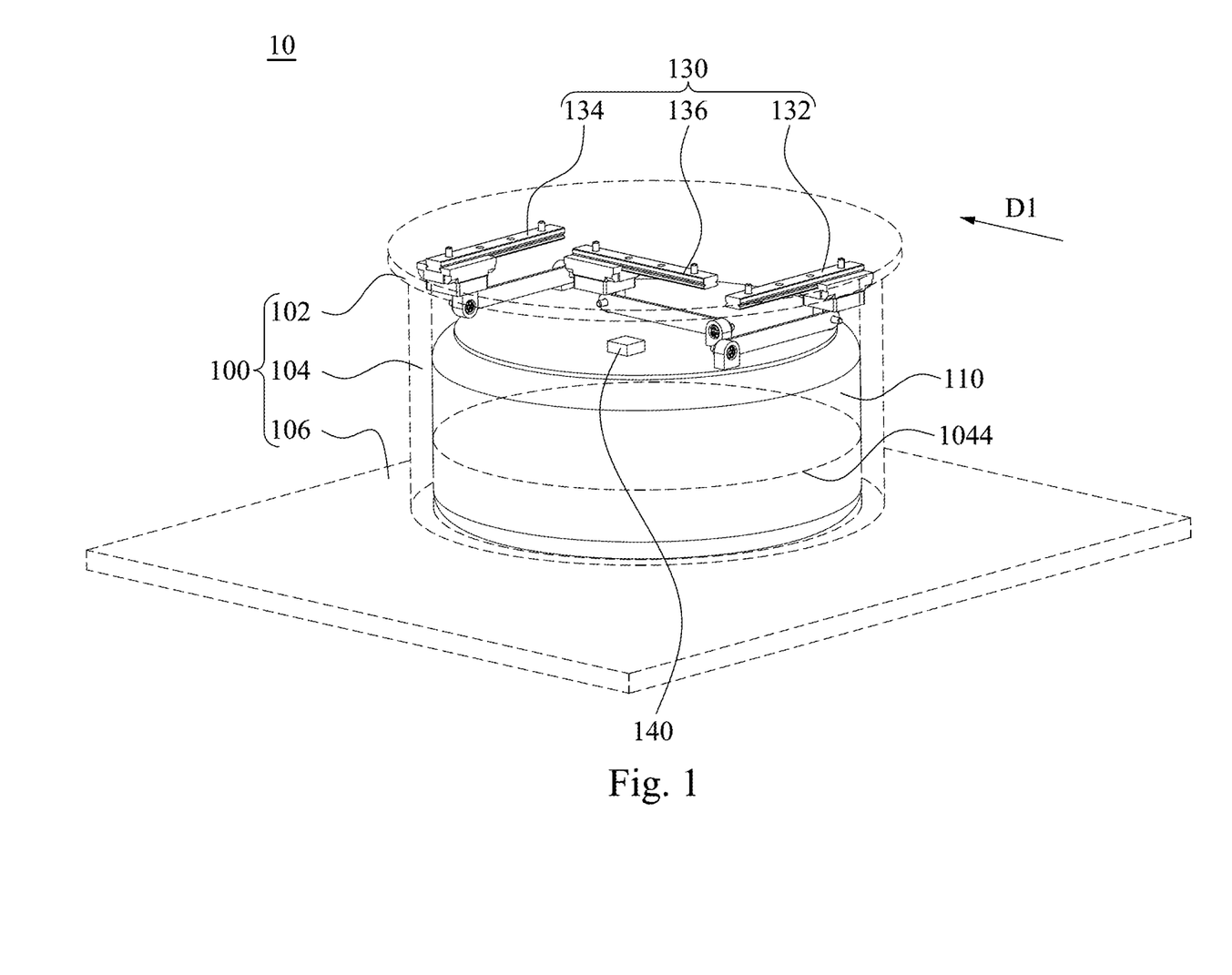
FIG. 1 is a schematic diagram illustrating a perspective view of a gas storage device in a folded state in accordance with some embodiments of the present disclosure.
Figure 2:
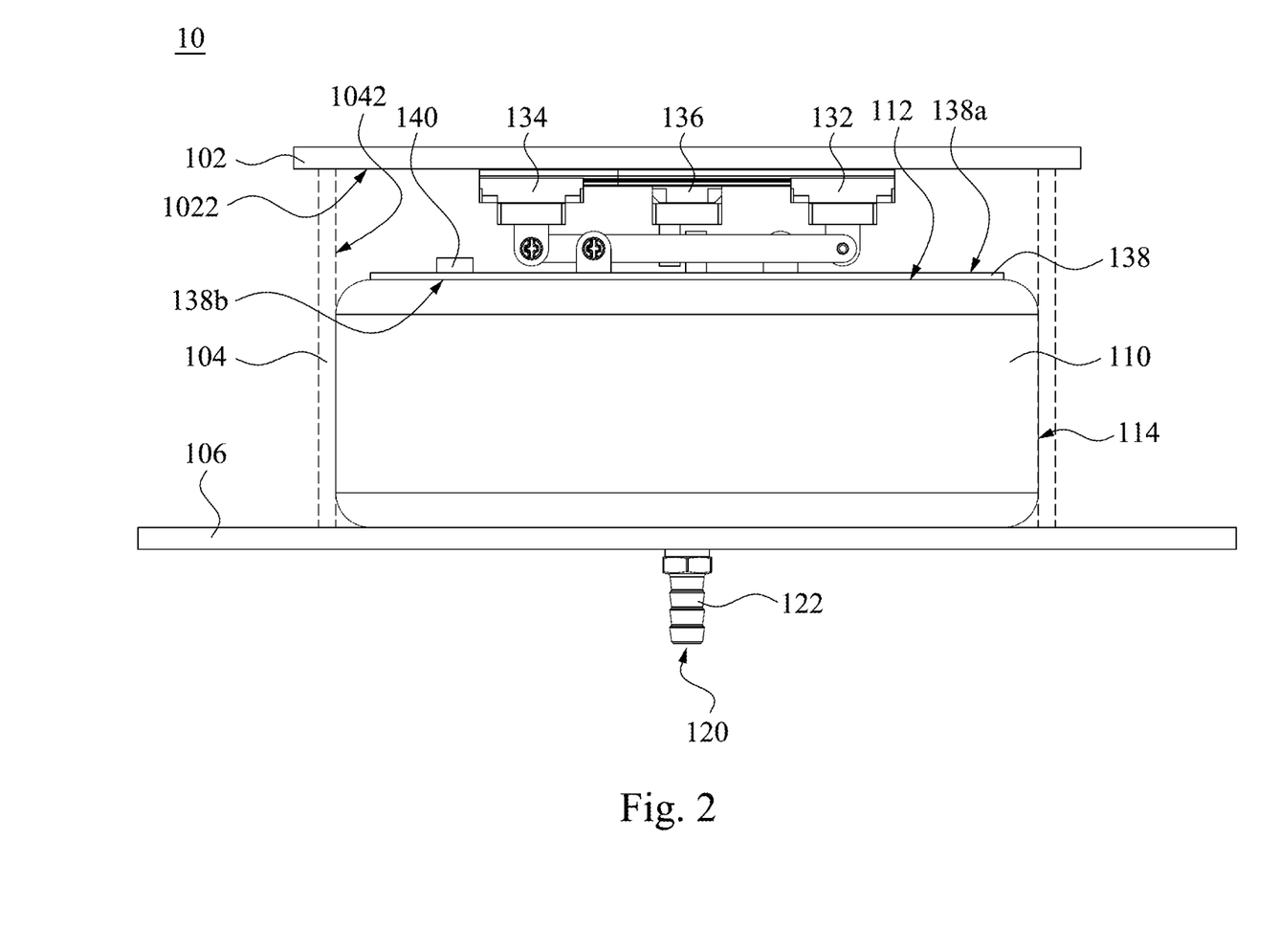
FIG. 2 is a schematic diagram illustrating a side view depicted according to the gas storage device in FIG. 1.

Reference is made to FIGS. 1 and 2 together. FIG. 1 is a schematic diagram illustrating a perspective view of a gas storage device 10 in a folded state in accordance with some embodiments of the present disclosure. FIG. 2 is a schematic diagram illustrating a side view along a direction D1 depicted according to the gas storage device 10 in FIG. 1. The gas storage device 10 includes a hollow casing 100, a gas storage bag 110, a gas tube 120, a retractable module 130, and a sensor 140. The gas storage bag 110 is located in the hollow casing 100. The gas tube 120 is arranged through the hollow casing 100 and in fluid communication between the gas storage bag 110 and an exterior space. The retractable module 130 is connected between a top surface 112 of the gas storage bag 110 and the top portion 102 of the hollow casing 100. The sensor 140 is positioned in the hollow casing 100. The gas storage bag 110 may expand when fluid is filled into the gas storage bag 110 through the gas tube 120, such that the retractable module 130 may be simultaneously folded. Conversely, the gas storage bag 110 may contract when fluid is drawn out of the gas storage bag 110 through the gas tube 120, such that the retractable module 130 may be simultaneously unfolded.

In some embodiments, the hollow casing 100 includes a top portion 102, a side portion 104, and a bottom portion 106. More specifically, the side portion 104 has a hollow tubular structure, in which two openings are respectively configured on both ends of the hollow tube. The top portion 102 and the bottom portion 106 may cover the two openings of the hollow tube, respectively. Due to the structural configuration of the top portion 102, the side portion 104 and the bottom portion 106, an accommodating space may be formed therein for containing the gas storage bag 110 and the retractable module 130. In some embodiments, each cross section 104a from top to bottom of the side portion 104 is circular and uniform in size, and the top portion 102 and the bottom portion 106 are in parallel with each other, so as to form a cylindrical accommodation space. When the gas storage bag 110 is placed into the cylindrical accommodation space, the hollow casing 100 may restrain the horizontal expansion of the gas storage bag 110, such that the gas storage bag 110 may merely extend in the vertical direction. It should be noted that the structure of the hollow casing 100 is not limited to the above-mentioned embodiments. For example, the hollow casing 100 may also be a one-piece component or have a structure with a non-circular cross section. It should be also noted that the top portion 102, the side portion 104 and the bottom portion 106 of the hollow casing 100 in the present disclosure may be referred to as a casing top, a casing sidewall and a casing bottom respectively. Further, regarding the corresponding names mentioned above, the difference therebetween merely lies in their names and the function and/or location thereof are not affected.

In some embodiments, the gas storage bag 110 is a one-piece bag structure that has a sealed storage space. When the gas storage bag 110 is placed into the hollow casing 100, the storage space of the gas storage bag 110 and the accommodating space of the hollow casing 100 may be isolated from each other. In other words, respective fluids in the above-mentioned two spaces do not communicate with each other, and thus the occurrence of fluid interactive contamination and/or fluid escape may be minimized. On the other hand, the gas storage bag 110 may include a flexible material. Hence, when the shape of the gas storage bag 110 changes due to fluid entry or exit, the flexible gas storage bag 110 may effectively minimize the occurrence of structural breakage resulted from material fatigue.

In some embodiments, as shown in FIG. 2, the gas tube 120 penetrates through the bottom portion 106 of the hollow casing 100. Both ends of the gas tube 120 are connected to the gas storage bag 110 and the external space, respectively. Due to the configuration of the gas tube 120, a fluid, e.g., a dielectric liquid vapor, may enter the gas storage bag 110 from the exterior space without obstruction and then be stored therein. In some embodiments, the gas tube 120 includes a bamboo-shaped joint 122 configured on one end of the gas tube 120 that connects the exterior space. When an external pipe is connected to the gas tube 120, the bamboo-shaped joint 122 may effectively strengthen the connection between the external pipe and the gas tube 120, so as to prevent slippage of the external pipe and/or leakage of the fluid. In some embodiments, the gas tube 120 is configured at a central point of the bottom portion 106 of the hollow casing 100. Hence, after the fluid enters the gas storage bag 110 through the gas tube 120, the fluid may fill the gas storage bag 110 uniformly and quickly.

In some embodiments, as shown in FIGS. 1 and 2, the retractable module 130 of the gas storage device 10 includes a plurality of retractable mechanisms and a bottom plate 138. More specifically, the retractable module 130 includes a first retractable mechanism 132, a second retractable mechanism 134, and a third retractable mechanism 136. The bottom plate 138 is connected to the top surface 112 of the gas storage bag 110. Due to the configuration of the first, second and third retractable mechanisms and the bottom plate 138, expansion and contraction of the gas storage bag 110 in the vertical direction may be further restricted, such that volume of the gas storage bag 110 and variation thereof may be more convenient to observe and analyze. Further, more detailed descriptions about the above-mentioned features will be presented and explained as follows.

Figure 6:
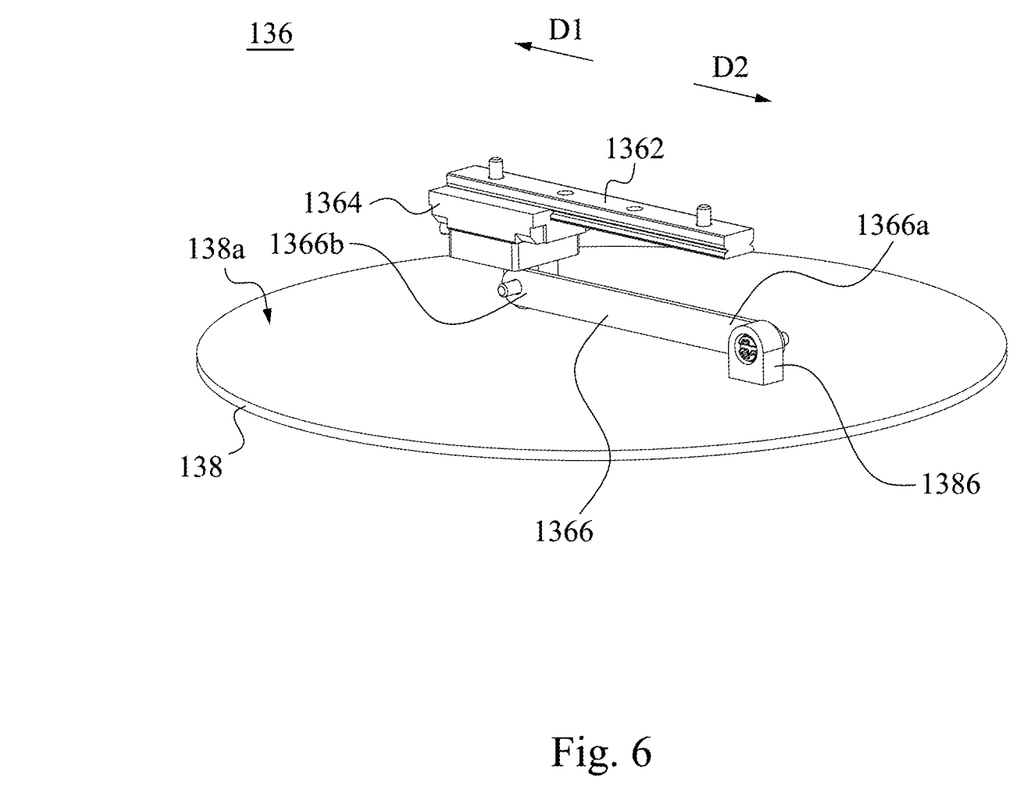
FIG. 6 is a schematic diagram illustrating a perspective view of a retractable mechanism and a bottom plate in accordance with some embodiments of the present disclosure.

Reference is made to FIGS. 2 and 6 together. FIG. 6 is a schematic diagram illustrating a perspective view of one retractable mechanism and the bottom plate 138 in accordance with some embodiments of the present disclosure. In some embodiments, each of the first, second, and third retractable mechanisms includes substantially the same components and has substantially the same component configuration. Therefore, the third retractable mechanism 136 is referenced hereinafter to more clearly illustrate the components and the component configuration of each of the retractable mechanisms.

More specifically, the third retractable mechanism 136 includes a slide rail 1362, a slide block 1364, and a connection rod 1366. The bottom surface 138b of the bottom plate 138 is connected to the top surface 112 of the gas storage bag 110. The slide rail 1362 is fixed to the inner wall 1022 of the top portion 102 of the hollow casing 100 and arranged parallel to the bottom plate 138. The slide block 1364 is connected to the slide rail 1362 and may slide thereon. The connection rod 1366 has a first end 1366a and a second end 1366b. The first end 1366a is pivotally connected to a fixed end 1386 that protrudes from the top surface 138a of the bottom plate 138. The second end 1366b is pivotally connected to the slide block 1364. When a fluid enters the gas storage bag 110, the gas storage bag 110 may expand only in the vertical direction due to the restriction of the hollow casing 100, and thus the bottom plate 138 is raised vertically. In the meantime, the bottom plate 138 may push the slide block 1364 along the first direction D1 by the connection rod 1366. Conversely, when the fluid is drawn out of the gas storage bag 110, the gas storage bag 110 may contract only in the vertical direction, and thus the bottom plate 138 may descend vertically due to gravity. In the meantime, the bottom plate 138 may pull the slide block 1364 along the second direction D2 by the connection rod 1366. In other words, the slide block 1364 may slide parallel to the inner wall 1022 of the top portion 102 of the hollow casing 100 in response to actuation of the connection rod 1366. Consequently, when the fluid is filled into or drawn out of the gas storage bag 110, the top surface 112 of the gas storage bag 110 may keep horizontal and move only in the vertical direction through coordination of the first, second and third retractable mechanisms and the bottom plate 138.

In some embodiments, the bottom plate 138 may be raised vertically to a highest position by the gas storage bag 110 when the fluid completely fills the gas storage bag 110. In the meantime, the slide rail 1362, the connection rod 1366, and the bottom plate 138 are in parallel with each other. In some embodiments, the fixed end 1386 that is pivotally connected with the connection rod 1366 on the bottom plate 138 may be located outside the projection area of the slide rail 1362 on the bottom plate 138. When the fluid is completely drawn out of the gas storage bag 110, the bottom plate 138 may descend vertically to a lowest position due to gravity, such that the slide block 1364 may stay at one end of the slide rail 1362 adjacent to the fixed end 1386. In the meantime, the connection rod 1366 may incline toward the first direction D1, so as to facilitate the folding operation of the retractable mechanism.

Reference is made to FIGS. 1 and 2 again. In some embodiments, as illustrated therein, the bottom plate 138 of the retractable module 130 may be a unitary flat member. In detail, the top surface 138a and the bottom surface 138b of the bottom plate 138 have substantially the same area. Additionally, the bottom surface 138b of the bottom plate 138 and the top surface 112 of the gas storage bag 110 have substantially the same area. Consequently, the vertical expansion of the gas storage bag 110 may be accurately transmitted to the retractable module 130.

In some embodiments, the cross section 1044 of the inner wall 1042 of the side portion 104 of the hollow casing 100 and the top surface 138a of the bottom plate 138 are both circular. Further, centers of the cross section 1044 and the top surface 138a are coaxial. In other words, the cross section 1044 and the top surface 138a are conformal.

Consequently, when the gas storage bag 110 is respectively connected to the hollow casing 100 and the bottom plate 138, wrinkles on the gas storage bag 110 may be effectively reduced, and thus breakage of the gas storage bag 110 resulted from the wrinkles may be minimized. On the other hand, in some embodiments, the area of the top surface 138a of the bottom plate 138 is smaller than the area of the cross section 1044 of the inner wall 1042 of the side portion 104. Consequently, the bottom plate 138 may be spaced apart from the inner wall 1042 of the side portion 104, so as to ensure that the bottom plate 138 is only moved by the expansion and contraction of the gas storage bag 110. Further, due to the above-mentioned structural configuration, when the side surface 114 of the gas storage bag 110 is partially bonded to the inner wall 1042 of the side portion 104 of the hollow casing 100, the bottom plate 138 may avoid contacting the bonding of the gas storage bag 110 and the side portion 104 during vertical movements of the bottom plate 138. Additionally, the gap between the bottom plate 138 and the side portion 104 may also accommodate the folded portion of the gas storage bag 110.

It should be noted that the configuration of the bottom plate 138 in the present disclosure is not limited to the above-mentioned embodiments. For example, according to various designs, the bottom plate 138 may have a surface shape different from the circular shape or may be assembled by a plurality of independent plates.

In some embodiments, as shown in FIG. 1, when the bottom plate 138 is connected to the top surface 112 of the gas storage bag 110, the first retractable mechanism 132 and the second retractable mechanism 134 are separately arranged adjacent to the peripheral region of the bottom plate 138 and respectively connected to the peripheral portion of the top portion 102. Further, the first and second retractable mechanisms are symmetrical with respect to the center of the bottom plate 138 or the top portion 102. On the other hand, the third retractable mechanism 136 is configured between the first and second retractable mechanisms and also connected to the central region of the top portion 102. More specifically, the first retractable mechanism 132 and the second retractable mechanism 134 are in parallel with each other. Two ends of the slide rail 1362 of the third retractable mechanism 136 are separately aligned with two respective midpoints of the slide rails of the first retractable mechanism 132 and the second retractable mechanism 134. In other words, the retractable module 130 may have a structural configuration that resembles the shape of alphabet "H" in a top view. In some embodiments, the pivotal joints of the respective connection rods of the first, second, and third retractable mechanisms and the bottom plate 138 are not distributed on substantially the same straight line. In detail, the three pivotal joints may define a plane that is coplanar with the top surface 138a of the bottom plate 138. Consequently, due to the above-mentioned structural configuration, when the fluid enters or leaves the gas storage bag 110, the bottom plate 138 may be raised or lowered through the first, second, and third retractable mechanisms while keeping horizontal.

It should be noted that the configuration of the retractable module 130 of the present disclosure is not limited to the above-mentioned embodiments. For example, in some embodiments, the retractable module 130 may merely include the first retractable mechanism 132 and the second retractable mechanism 134 that is in parallel spaced relationship to the first retractable mechanism 132. In some embodiments, the retractable module 130 may have a polygonal structure configuration (e.g., quadrilateral and pentagon configuration) in a top view.

Figure 3:
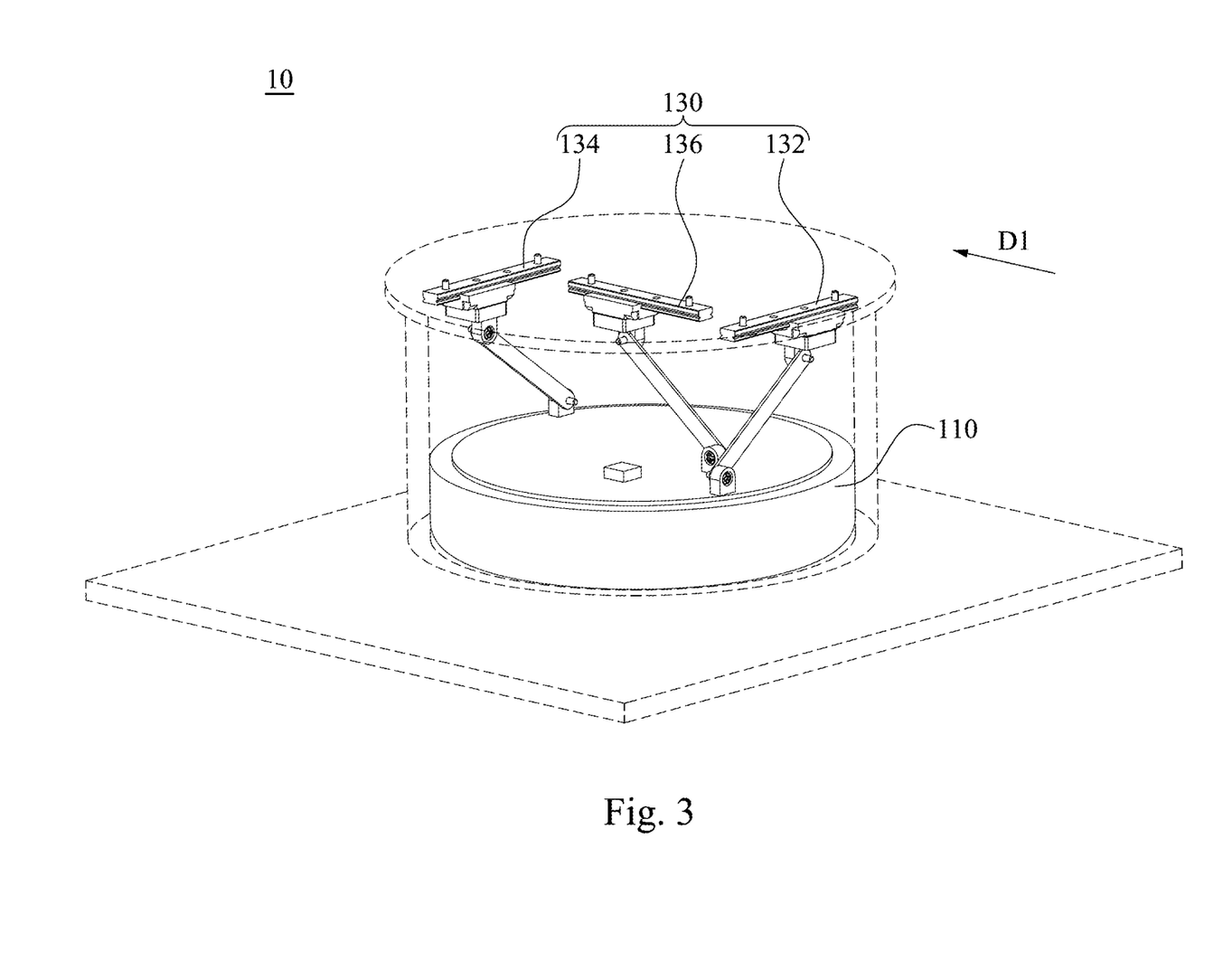
FIG. 3 is a schematic diagram illustrating a perspective view of a gas storage device in a partially folded state in accordance with some embodiments of the present disclosure.

Reference is made to FIG. 3. FIG. 3 is a schematic diagram illustrating a perspective view of a gas storage device 10 in a partially folded state in accordance with some embodiments of the present disclosure. When the fluid is gradually drawn out of the gas storage bag 110 through the gas tube 120, the gas storage bag 110 may contract and make the retractable module 130 gradually unfolded. In other words, the state of components shown in FIG. 1 may gradually change to the state of components shown in FIG. 3. More specifically, the top surface 112 of the gas storage bag 110 may descend vertically due to volume reduction of the gas storage bag 110, such that the bottom plate 138 may also descend vertically since support from the gas storage bag 110 is reduced. Further, the bottom plate 138 may pull each of the slide blocks from one end of the respective slide rails towards the other end thereof by the respective connection rods. Consequently, the bottom plate 138 may descend along with the top surface 112 of the gas storage bag 110 while keeping horizontal.

Figure 4:
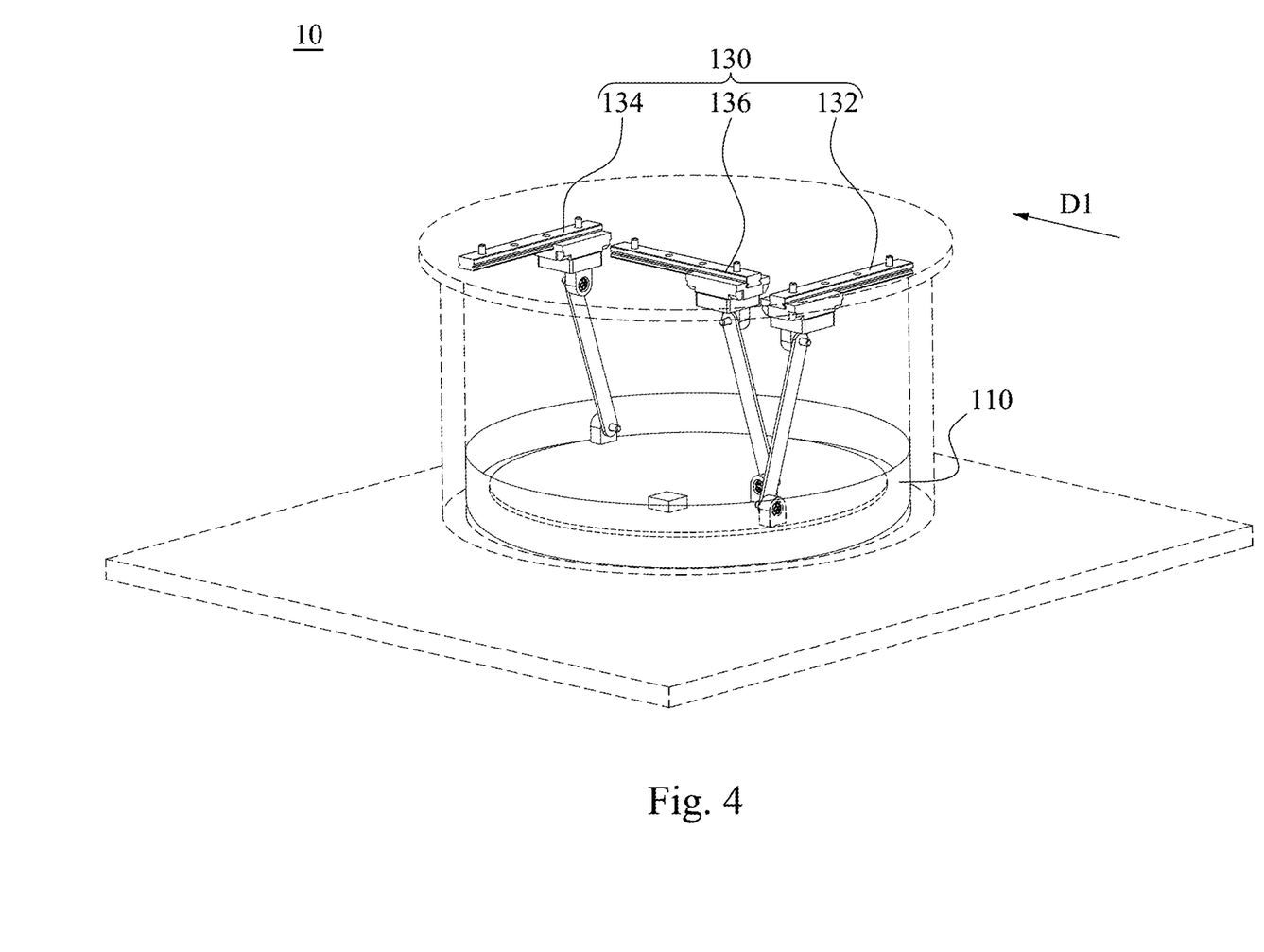
FIG. 4 is a schematic diagram illustrating a perspective view of a gas storage device in an unfolded state in accordance with some embodiments of the present disclosure.
Figure 5:
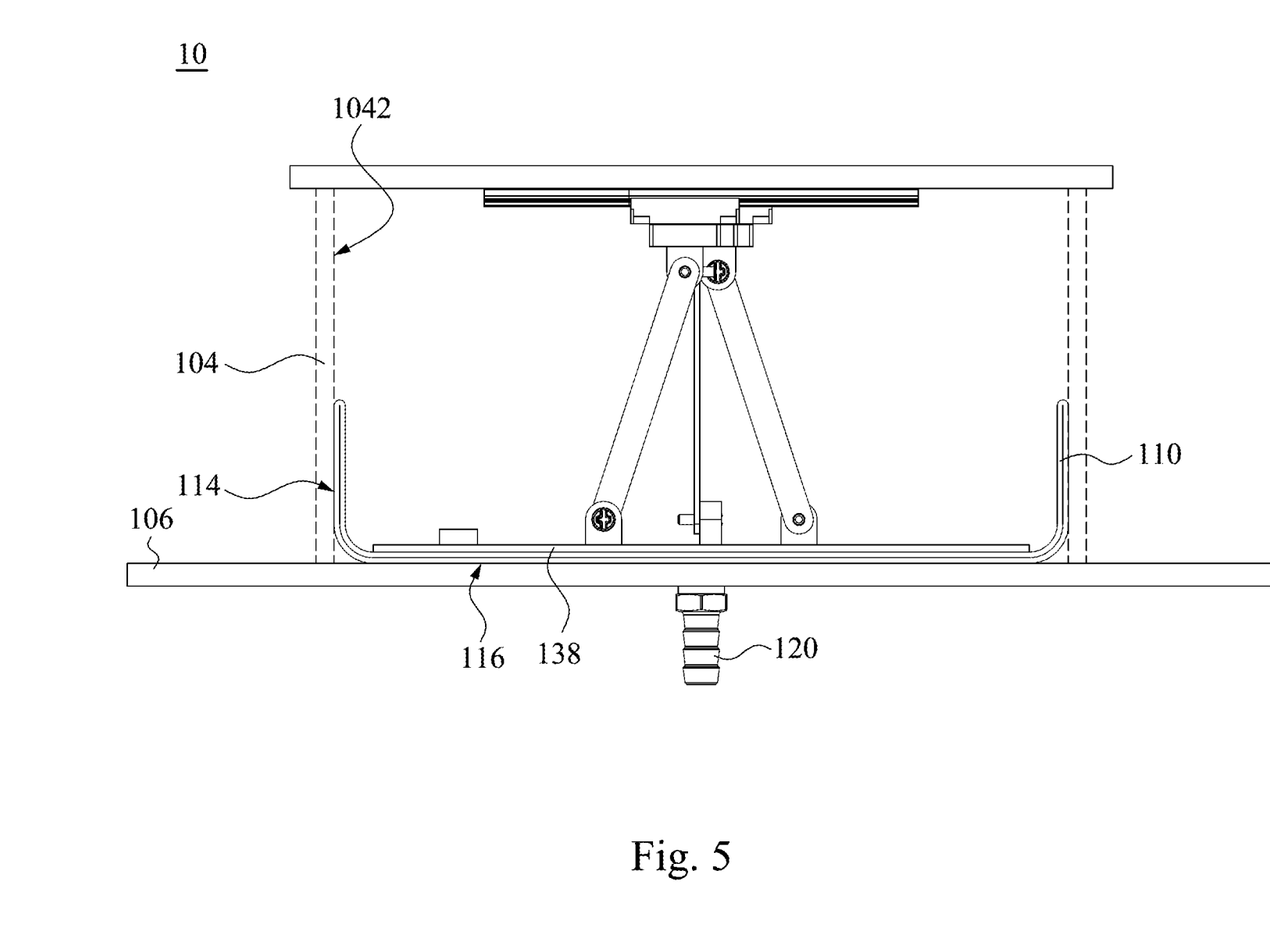
FIG. 5 is a schematic diagram illustrating a side view depicted according to the gas storage device in FIG. 4.

Reference is made to FIGS. 4 and 5 together. FIG. 4 is a schematic diagram illustrating a perspective view of a gas storage device 10 in an unfolded state in accordance with some embodiments of the present disclosure. As shown in FIGS. 4 and 5, after the fluid is completely drawn out of the gas storage bag 110 through the gas tube 120, the bottom plate 138 may descend to the lowest position, and thus the retractable module 130 is entirely unfolded. In the meantime, the bottom plate 138 may pull each of the slide blocks from one end of the respective slide rails to the other end thereof by the respective connection rods.

In some embodiments, the lower half of the side surface 114 of the gas storage bag 110 is bonded to the inner wall 1042 of the side portion 104 of the hollow casing 100. Further, when the height of the bottom plate 138 drops to half of the side surface 114 of the gas storage bag 110, the lower half of the side surface 114 of the gas storage bag 110 may no longer be folded as the bottom plate 138 descends. Subsequently, as the bottom plate 138 continues to descend, the upper half of the side surface 114 of the gas storage bag 110 may be successively and movably attached onto the lower half of side surface 114, such that the double-layer structure of the gas storage bag 110 may be formed. It should be noted that the bonding position of the side surface 114 of the gas storage bag 110 and the side portion 104 of the hollow casing 100 is not limited to the above-mentioned embodiments. In some embodiments, the side surface 114 of the gas storage bag 110 may be partially bonded to the inner wall 1042 of the side portion 104 merely at the height of half of the side surface 114. In some embodiments, the bottom surface 116 of the gas storage bag 110 may be further bonded to the bottom portion 106 of the hollow casing 100, such that volume variation of the gas storage bag 110 may correspond to the height change of the bottom plate 138 even more accurately.

It should be noted that, regarding the atmospheric two-phase immersion cooling device, pressure variation in the device is controlled to fall within a small range for reducing the influence of pressure on the boiling point of the dielectric liquid. Consequently, it may be difficult for a user to know the condition of the dielectric liquid vapor in the device through the pressure variation in the device. However, due to the structural configuration of the hollow casing 100 and the retractable module 130, the gas storage bag 110 may be limited to expand or contract merely in the vertical direction. Further, when the volume of the gas storage bag 110 changes due to fluid entry or exit, the bottom plate 138 of the retractable module 130 may be correspondingly moved in the vertical direction while keeping horizontal. Consequently, the user may clearly know the volume of fluid in the gas storage bag 110 and the change thereof simply by observing the position of the bottom plate 138 in the vertical direction.

In some embodiments, the gas storage device 10 further includes a sensor 140. More specifically, the sensor 140 may be a distance sensor or a proximity sensor. Further, the sensor 140 may be positioned on the bottom plate 138 to sense the height of the bottom plate 138 (i.e., the distance between the bottom plate 138 and the bottom portion 106) or sense the distance between the bottom plate 138 and the top portion 102. Subsequently, the volume of the gas storage bag 110 and the change thereof may be analyzed and calculated. It should be noted that the type and location of the sensor 140 are not limited to the above-mentioned embodiments. For example, the sensor 140 may be configured on the inner wall 1022 of the top portion 102 of the hollow casing 100 to calculate the volume of the gas storage bag 110 and the changes thereof by measuring the distance between the bottom plate 138 and itself. On the other hand, the volume change of the gas storage bag 110 may represent the difference between rates of heat generation and heat dissipation in the atmospheric two-phase immersion cooling device. When rising of the volume of the gas storage bag 110 is measured, the sensor 140 may know that the rate of heat dissipation by the condenser in the device is insufficient, such that the condenser in the device may be further informed to increase the rate of heat dissipation. Conversely, when falling of the volume of the gas storage bag 110 is measured, the sensor 140 may inform the condenser in the device to decrease the rate of heat dissipation for reducing energy consumption. Consequently, the sensor 140 may improve controlling of the condenser in the device.

According to the detailed descriptions above with respect to various embodiments of the present disclosure, it may be understood that, the gas storage device of the present disclosure may restrict the expansion and contraction of the gas storage bag by the hollow casing and the retractable module to make the observation of the volume change of the gas storage bag more convenient. More specifically, the hollow casing may limit the horizontal expansion of the gas storage bag. Since the bottom plate of the retractable module is entirely connected to the top surface of the gas storage bag, the gas storage bag may raise the bottom plate vertically when the gas storage bag extends in the vertical direction. On the other hand, the side surface of the gas storage bag may be bonded to the hollow casing. When the volume of the gas storage bag decreases, the bottom plate may descend vertically as the gas storage bag contracts in the vertical direction. Further, when the height of the bottom plate drops to the height of the bonding position of the gas storage bag and the hollow casing, the side surface of the gas storage bag below the bonding position may no longer be folded. Subsequently, as the bottom plate continues to descend, the side surface of the gas storage bag above the bonding position may be successively and movably attached onto the side surface of the gas storage bag below the bonding position, such that a double-layer structure of the gas storage bag may be formed. Consequently, a user may easily know the volume of the gas storage bag and the change thereof simply by observing the position of the bottom plate in the vertical direction. Additionally, the gas storage device of the present disclosure may utilize an integrally formed gas storage bag to store inflow fluid, such that occurrence of structural breakage may be minimized thereby.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the scope of the present disclosure, and it is envisaged that various changes, substitutions, and alterations may be made.

What is claimed is:

1. A gas storage device, comprising:
   a hollow casing having a casing top, a casing sidewall, and a casing bottom;
   a gas storage bag disposed in the hollow casing;
   a gas tube disposed through the casing bottom and in fluid communication between the gas storage bag and an exterior space; and
   a retractable module connected between a top surface of the gas storage bag and the casing top, the retractable module comprising a plurality of retractable mechanisms and a bottom plate, the bottom plate being connected to the top surface of the gas storage bag, and at least one of the retractable mechanisms comprising:
   a slide rail disposed on the casing top;
   a slide block movably connected to the slide rail; and
   a connection rod having two ends pivotally connected to the slide block and the bottom plate respectively,
   wherein the slide block slides parallel to the casing top in response to an operation of the connection rod, the gas storage bag expands when fluid is filled into the gas storage bag through the gas tube such that the retractable module is folded, and the gas storage bag contracts when fluid is drawn out of the gas storage bag through the gas tube such that the retractable module is unfolded.

2. The gas storage device of claim 1, wherein the retractable module comprises:
   a first retractable mechanism disposed adjacent to a peripheral region of the top surface of the gas storage bag and connected to the casing top; and
   a second retractable mechanism disposed adjacent to the peripheral region of the top surface of the gas storage bag, in parallel spaced relationship to the first retractable mechanism, and connected to the casing top.

3. The gas storage device of claim 2, wherein the retractable module further comprises a third retractable mechanism that is connected to a central region of the casing top.

4. The gas storage device of claim 3, wherein pivotal joints of the respective connection rods of the first, second, and third retractable mechanisms and the bottom plate are not distributed on the same straight line.

5. The gas storage device of claim 1, wherein the bottom plate of the retractable module is a unitary flat member, and a cross section of the casing sidewall of the hollow casing and a top surface of the bottom plate are both circular.

6. The gas storage device of claim 1, wherein an area of a top surface of the bottom plate is smaller than a cross section area of the casing sidewall of the hollow casing.

7. The gas storage device of claim 6, wherein the top surface of the bottom plate and a bottom surface of the bottom plate have the same area, and the bottom surface of the bottom plate and the top surface of the gas storage bag have the same area.

8. The gas storage device of claim 1, wherein when the retractable module is folded or unfolded, each pivotal joint of the respective connection rods of the first, second, and third retractable mechanisms and the bottom plate is located outside a projection area of the respective slide rails on the bottom plate.

9. The gas storage device of claim 1, wherein a lower half of a side surface of the gas storage bag is bonded to the casing sidewall.

10. The gas storage device of claim 1, further comprising a sensor disposed in the hollow casing and configured to measure a volume of the gas storage bag.

\* \* \* \* \*